(12) United States Patent
Lautzenhiser

(10) Patent No.: US 8,188,794 B2
(45) Date of Patent: May 29, 2012

(54) METHOD AND SYSTEM FOR PROVIDING AUTOMATIC GATE BIAS FOR FIELD EFFECT TRANSISTORS

(76) Inventor: Lloyd Lautzenhiser, Nobel (CA)

( * ) Notice: Subject to any disclaimer, the term of this patent is extended or adjusted under 35 U.S.C. 154(b) by 0 days.

(21) Appl. No.: 13/072,474

(22) Filed: Mar. 25, 2011

(65) Prior Publication Data

US 2011/0279185 A1  Nov. 17, 2011

Related U.S. Application Data

(60) Provisional application No. 61/340,960, filed on Mar. 25, 2010.

(51) Int. Cl.
    *H03G 3/10* (2006.01)
(52) U.S. Cl. ........................ 330/285; 330/296
(58) Field of Classification Search .................. 330/285, 330/289, 296
    See application file for complete search history.

(56) References Cited

U.S. PATENT DOCUMENTS

| | | | |
|---|---|---|---|
| 448,671 A | 12/1984 | Sugawara | |
| 484,326 A | 6/1989 | Jiang | |
| 540,622 A | 4/1995 | Iida et al. | |
| 542,259 A | 6/1995 | Fujihira | |
| 549,325 A | 2/1996 | Murtojarvi | |
| 567,091 A | 9/1997 | Hori et al. | |
| 594,337 A | 8/1999 | Kokuryo et al. | |
| 5,986,509 A * | 11/1999 | Lohninger | 330/290 |
| 306,783 A | 3/2000 | Kaminishi | |
| 604,664 A | 4/2000 | Brayton et al. | |
| 609,130 A | 7/2000 | Arevalo | |
| 621,535 A1 | 4/2001 | Hon et al. | |
| 628,861 A1 | 9/2001 | Bennett | |
| 630,413 A1 | 10/2001 | Poulin et al. | |
| 639,249 A1 | 5/2002 | Ohkawa et al. | |
| 644,861 A1 | 9/2002 | Perugupalli et al. | |
| 648,672 A1 | 11/2002 | Sakamoto et al. | |
| 6,515,546 B2 * | 2/2003 | Liwinski | 330/296 |
| 6,838,932 B2 * | 1/2005 | Izumiyama et al. | 330/51 |
| 7,109,800 B2 * | 9/2006 | Noh et al. | 330/296 |
| 7,242,252 B2 * | 7/2007 | Taylor | 330/296 |
| 728,601 A1 | 10/2007 | Svechtarov et al. | |

(Continued)

FOREIGN PATENT DOCUMENTS

JP     19940107336     8/1995

OTHER PUBLICATIONS

Inahashi Atsushi & Hori Tsugio, Power Consumption Reduction System for FET Amplifier, Patent Abstracts of Japan, Aug. 12, 1995.

*Primary Examiner* — Henry Choe
(74) *Attorney, Agent, or Firm* — Valenti, Hanley & Robinson, PLLC; Kevin T. Duncan

(57) ABSTRACT

The present invention provides a feedback gate bias circuit for use in radio frequency amplifiers to more effectively control operation of LDFET, GaNFET, GaAsFET, and JFET type transistors used in such circuits. The invention provides a transistor gate bias circuit that senses drain current and automatically adjusts or biases the gate voltage to maintain drain current independently of temperature, time, input drive, frequency, as well as from device to device variations. The invention provides additional circuits to provide temperature compensation, RF power monitoring and drain current control, RF output power leveler, high power gain block, and optional digital control of various functions.

21 Claims, 13 Drawing Sheets

U.S. PATENT DOCUMENTS

| | | |
|---|---|---|
| 734,022 A1 | 3/2008 | Monroe et al. |
| 734,554 A1 | 3/2008 | Wang et al. |
| 734,885 A1 | 3/2008 | Mordkovich |
| 7,522,001 B2 * | 4/2009 | Yamamoto et al. ........... 330/285 |
| 761,261 A1 | 11/2009 | Chen |
| 2002/0079973 A1 | 6/2002 | Higashi et al. |

* cited by examiner

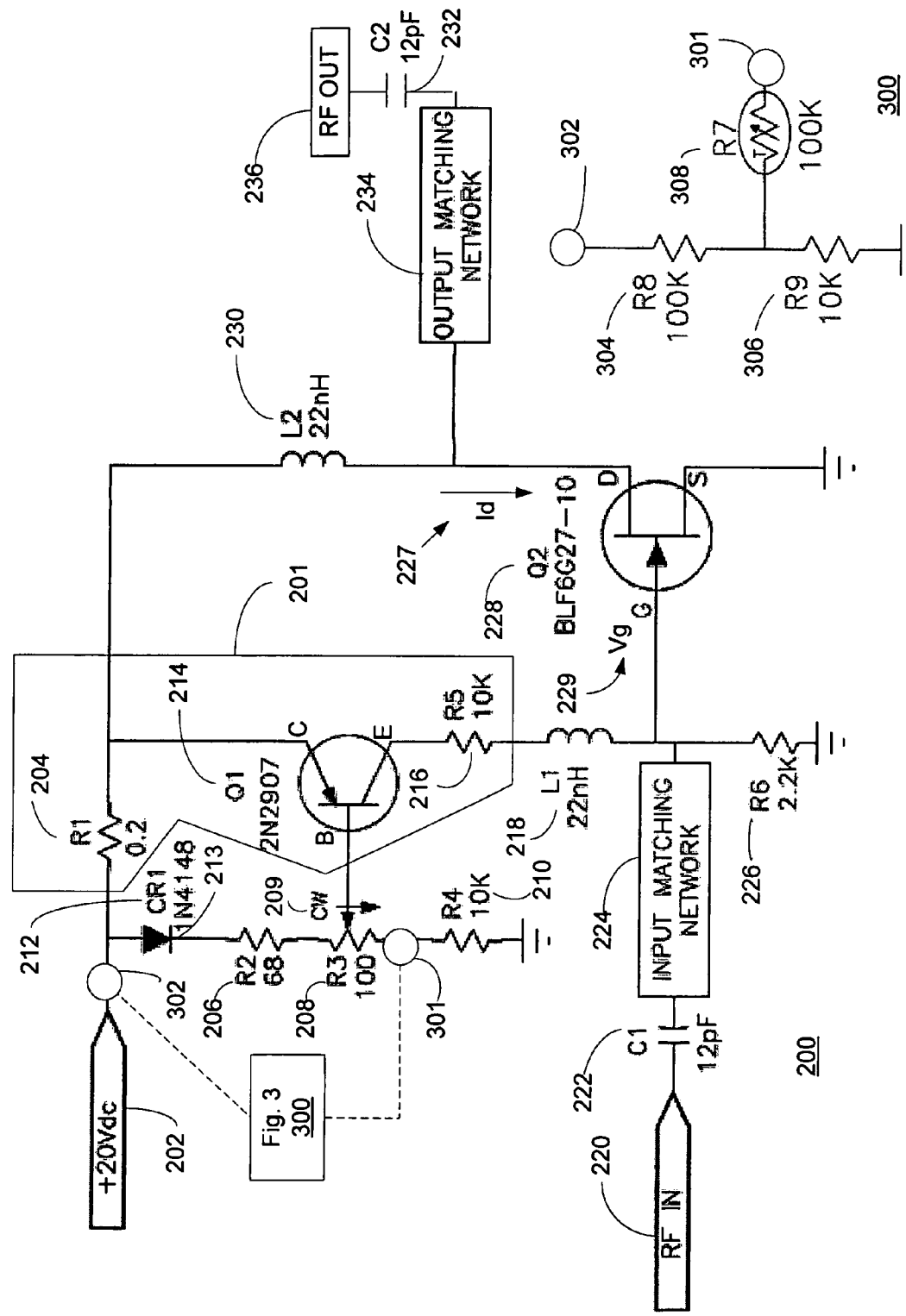

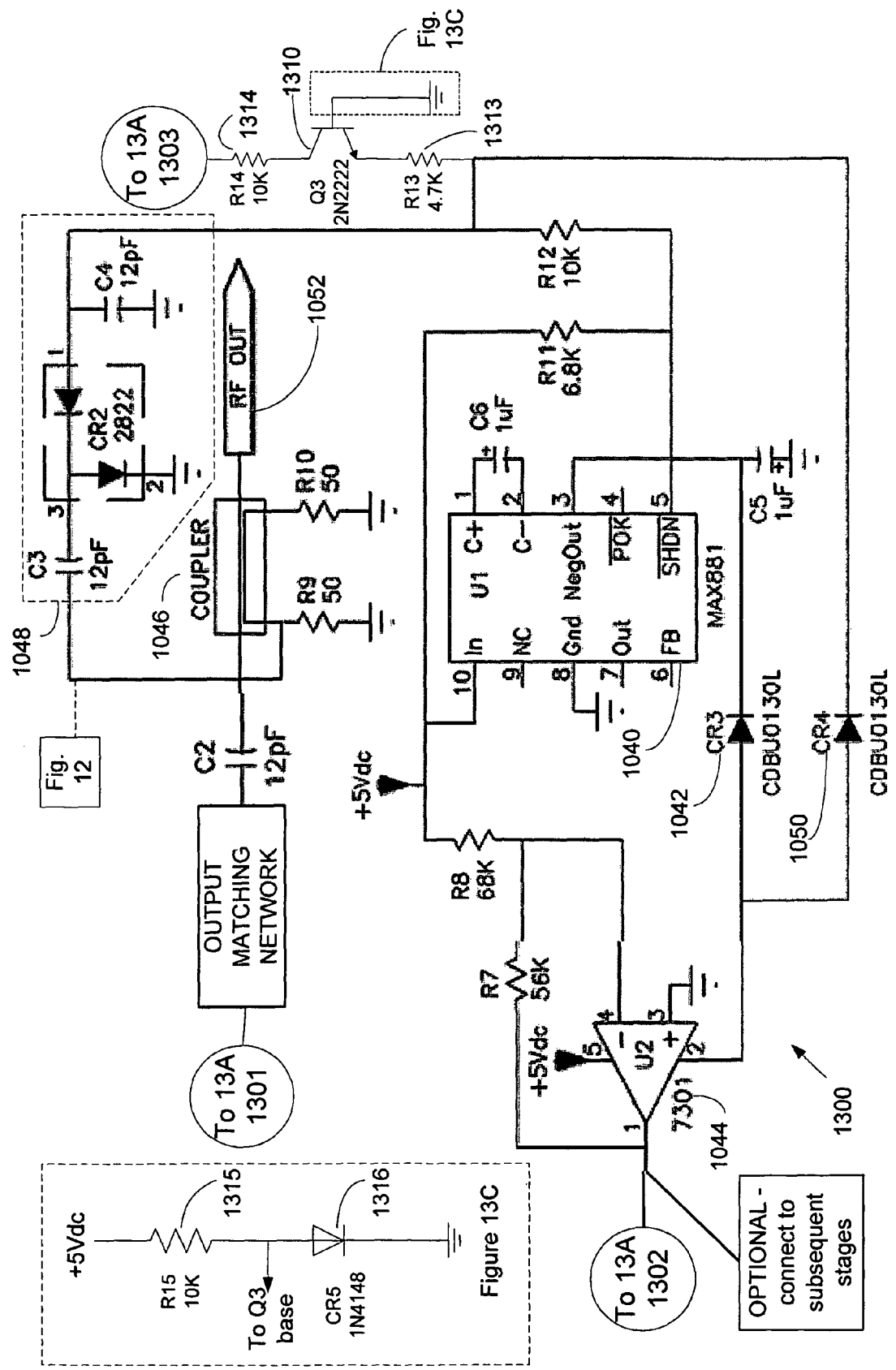

METHOD AND SYSTEM FOR PROVIDING AUTOMATIC GATE BIAS FOR FIELD EFFECT TRANSISTORS

CROSS-REFERENCE TO RELATED PATENT APPLICATIONS

This patent application claims priority to U.S. Provisional Patent Application No. 61/340,960, filed Mar. 25, 2010, entitled "METHOD AND SYSTEM FOR PROVIDING AUTOMATIC GATE BIAS FOR FIELD EFFECT TRANSISTORS," which is hereby incorporated by reference herein in its entirety.

FIELD OF THE INVENTION

The present invention relates generally to apparatus and method for amplifying radio frequency (RF) signals, including microwave RF signals. More particularly, the present invention pertains to a transistor gate bias circuit for RF amplifier applications to overcome device variations and changing operating conditions to control and maintain transistor drain current.

BACKGROUND OF THE INVENTION

The present invention provides an RF amplifier gate bias circuit that is appropriate for use in a wide range of frequencies and applications having no particular bounds and including KHz to GHz, including in the L, S, and C bands. The S band ranges from 2 to 4 GHz and is part of the microwave band of the electromagnetic spectrum used in weather radar, surface ship radar, and communications satellites applications. The L band, referred to as the IEEE L band, is a portion of the microwave band of the electromagnetic spectrum ranging from 1 to 2 GHz. The L band is used in communications, digital audio broadcast, satellite communications, telecommunications, military, telemetry as well as other applications. For instance, the Global Positioning System (GPS) utilizes carriers in the L band. Uses for IEEE C-band frequencies, which extend from 4 to 8 GHz, include satellite communications, weather radar, and military applications.

Laterally Diffused Field Effect Transistor (LDFET), also referred to as Laterally Diffused Metal-Oxide Semiconductor (LDMOS), type Radio Frequency (RF) devices have several advantages over bipolar transistors such as higher gain, higher efficiency, and wider dynamic range of output power. LDFETs also have a major disadvantage in that the gate bias voltage ($V_g$) required to set the quiescent current ($I_d$) drifts over temperature, time, input drive, and frequency, as well as from device to device variations. Considerable effort has been expended by the various manufacturers of these devices to lessen this undesirable effect, but no one has fully solved the problem.

Exemplary uses of the RF amplifier gate bias circuit of the present invention are transmission applications, including transmitters, receivers, and power amplifiers.

What is needed is a solution to address the various undesirable operational side effects associated with use of LDFET, GaNFET, GaAsFET, JFET and other such transistors to more fully and efficiently take advantage and utilize their beneficial properties and to expand the acceptable use of such devices in a wider range of RF applications.

SUMMARY OF THE INVENTION

The present invention is intended for many uses and applications including in design and manufacture of airborne and ground-based telemetry equipment, including aircraft (manned and unmanned), ground vehicles, fixed systems and military telemetry equipment. Telemetry system components include transmitters, receivers, and power amplifiers in a wide variety of frequency ranges. As in many areas, there is a growing need and desire for telemetry components that are low cost, low power consumption (for battery, heat and other concerns), light weight, low failure rate, less complex, compact, more robust and rugged design for harsh environments, and of course high performance. For instance, the RF amplifier gate bias circuit of the present invention may be incorporated in transmitters, receivers, and power amplifiers.

In one aspect, the invention provides a transistor gate bias circuit for RF amplifiers that senses drain current and automatically adjusts or biases the gate voltage to maintain drain current independently of temperature, time, input drive, frequency, as well as from device to device variations.

In another aspect of the invention a major advantage over prior art is that unlike conventional gain blocks, the supply current varies according to the output power required to maintain a constant gain.

In yet another aspect of the invention an advantage over prior circuits is that it does not attempt to minimize the spurious responses by better decoupling or improved grounding or any of the other known techniques. Rather, the circuit of the invention eliminates the problem entirely by shutting down the negative voltage deriving oscillator once it is no longer needed.

In one embodiment, the present invention involves an RF amplifier circuit comprising: a FET for receiving a RF input signal and generating an amplified RF output signal, the FET having a gate, drain, and source; a control circuit, connected to the gate and drain of the FET, for controlling the current at the drain; and a bias circuit comprising a means for biasing and variably compensating drift in the gate threshold voltage required to set the quiescent drain current, the bias circuit being connected to the control circuit and controlling operation of the control circuit to maintain constant current at the drain at wake-up transition; whereby the output remains essentially constant relative to external temperature.

Further, the present invention may comprise temperature-sensing means, connected to the control circuit, for sensing change in temperature; and thermal compensation means, connected to the temperature-sensing means and control circuit, for automatically adjusting the drain current if the temperature decreases or increases to maintain essentially constant output with respect to temperature; whereby the control circuit maintains essentially constant current at the drain with respect to time, input drive, frequency, and device-to-device variations, but not temperature. The present invention may be adapted to provide essentially constant output power throughout operation, including wake-up transition and post-wake-up transition operation.

The thermistor of the present invention may comprise both the temperature-sensing means and the thermal compensation means.

The present invention may also comprise: detecting means, connected to the RF input signal, for detecting the power level of the RF input signal and supplying a DC voltage representative of the detected power level; means for producing a variable reference voltage; comparing means, having an input for receiving the variable reference voltage and being connected to the detecting means, for comparing the supplied DC voltage to the variable reference voltage; and switching means, connected to the comparing means and the bias circuit, for turning off the LDFET if the input signal level is less than the variable reference voltage; wherein disposed intermediate of the RF input signal and the detecting means is one of a group consisting of a capacitor and a coupler.

Moreover, the present invention may further comprise: detecting means, connected to the RF output signal of the circuit, for detecting the level of the output signal and supplying a DC voltage representative of the detected output signal level; means for producing a variable reference voltage; and adjusting means, connected to the detecting means, the variable reference voltage and the bias circuit, for automatically increasing or decreasing the drain current if the supplied DC voltage is lower or higher (respectively) than the reference voltage to maintain essentially constant output RF power; wherein the disposed intermediate of the RF output signal and the detecting means is one of a group consisting of a capacitor and a coupler.

Additionally, the present invention may further comprise: a digital reference voltage generator adapted to produce and output a digital signal representing the reference voltage; and a digital-to-analog convertor having an input for receiving the digital signal, and an output connected to the adjusting means for supplying a computer-controllable analog reference voltage signal to the adjusting means.

The present invention may also further comprise: a first detecting means, connected to the RF input signal of the circuit, for detecting the power level of the input signal and supplying a DC voltage representative of the detected input signal level; and a second detecting means, connected to the RF output signal of the circuit, for detecting the level of the output signal and supplying a DC voltage representative of the detected output signal level; and an adjusting means, connected to the first detecting means, the second detecting means and the bias circuit, for automatically increasing or decreasing the drain current if the second supplied DC voltage is lower or higher (respectively) than the first supplied DC voltage by an amount necessary to maintain an essentially constant gain; wherein disposed intermediate of the RF input signal and the detecting means is one of a group consisting of a first capacitor and a first coupler, and wherein disposed intermediate of the RF output signal and the detecting means is one of a group consisting of a second capacitor and a second coupler.

Also, the present invention may further comprise: a digital attenuator, connected to the RF input signal and the first detecting means, for adjusting a gain of the circuit. In addition, the present invention may also involve comprising: means for producing a negative voltage signal; a voltage regulator having an input and an output, the input connected to the negative voltage producing means and the drain of the FET, the output connected to the gate of the FET, the voltage regulator adapted to supply a regulated negative voltage signal to the gate of the FET; and a shutdown means, connected to the negative voltage producing means, for shutting down the negative voltage producing means after a FET wake-up transition; and whereby the voltage regulator supplies a regulated negative voltage signal to the gate of the FET both during and after the FET wake-up transition; wherein the voltage regulator comprises: an inverting amplifier comprising an operational amplifier, the negative supply of the operational amplifier being connected to the negative voltage producing means and the drain of the FET; wherein the means for biasing and variably compensating drift comprises a variable resistance device; and wherein the FET is one of a group consisting of LDFET, GaNFET, GaAsFET, JFET, and MOSFET.

In yet another embodiment, the present invention provides a method comprising: receiving by a FET a RF input signal and generating an amplified RF output signal, the FET having a gate, drain, and source; controlling the current at the drain by biasing and variably compensating drift in the gate threshold voltage required to set the quiescent drain current to maintain an essentially constant current at the drain in connection with a wake-up transition; and based at least in part on temperature change, automatically altering the drain current to maintain essentially constant output power with respect to temperature; maintaining essentially constant drain current with respect to time, input drive, frequency, and device-to-device variations, while allowing a change in drain current with respect to temperature variations.

BRIEF DESCRIPTION OF THE DRAWINGS

In order to facilitate a full understanding of the present invention, reference is now made to the accompanying drawings, in which like elements are referenced with like numerals. These drawings should not be construed as limiting the present invention, but are intended to be exemplary and for reference.

FIG. 2 is a schematic of a first embodiment of a LDFET amplifier of the present invention with the automatic gate bias circuit;

FIG. 3 is a schematic of an optional temperature compensation circuit for use with the amplifier of FIG. 2;

FIG. 13B is a schematic of a second half of the alternative second embodiment of a GaNFET-based amplifier of the present invention with gate bias circuit for connection with the remaining circuitry of FIG. 13A; and FIG. 13C is an alternative transistor base input circuit for the circuit of FIG. 13B.

DETAILED DESCRIPTION OF THE PREFERRED EMBODIMENT

The present invention will now be described in more detail with reference to exemplary embodiments as shown in the accompanying drawings. While the present invention is described herein with reference to the exemplary embodiments, it should be understood that the present invention is not limited to such exemplary embodiments. Those possessing ordinary skill in the art and having access to the teachings herein will recognize additional implementations, modifications, and embodiments, as well as other applications for use of the invention, which are fully contemplated herein as within the scope of the present invention as disclosed and claimed herein, and with respect to which the present invention could be of significant utility.

The following exemplary circuits contain values which are typical for operation at +20VDC and in the 2 to 3 GHz band and help explain the inventive contribution in terms of performance. Although the invention may be described in examples in the GHz range, it should be understood that the invention has broad application in RF applications including in the KHz range. LDFETs generally have application up to 3 GHz while GaAs and GaN FETs typically have application up to 20-30 GHz. Although particular parts and values are shown, these are by way of example to help explain the invention and are not to be considered limiting to the invention.

Figure 1:
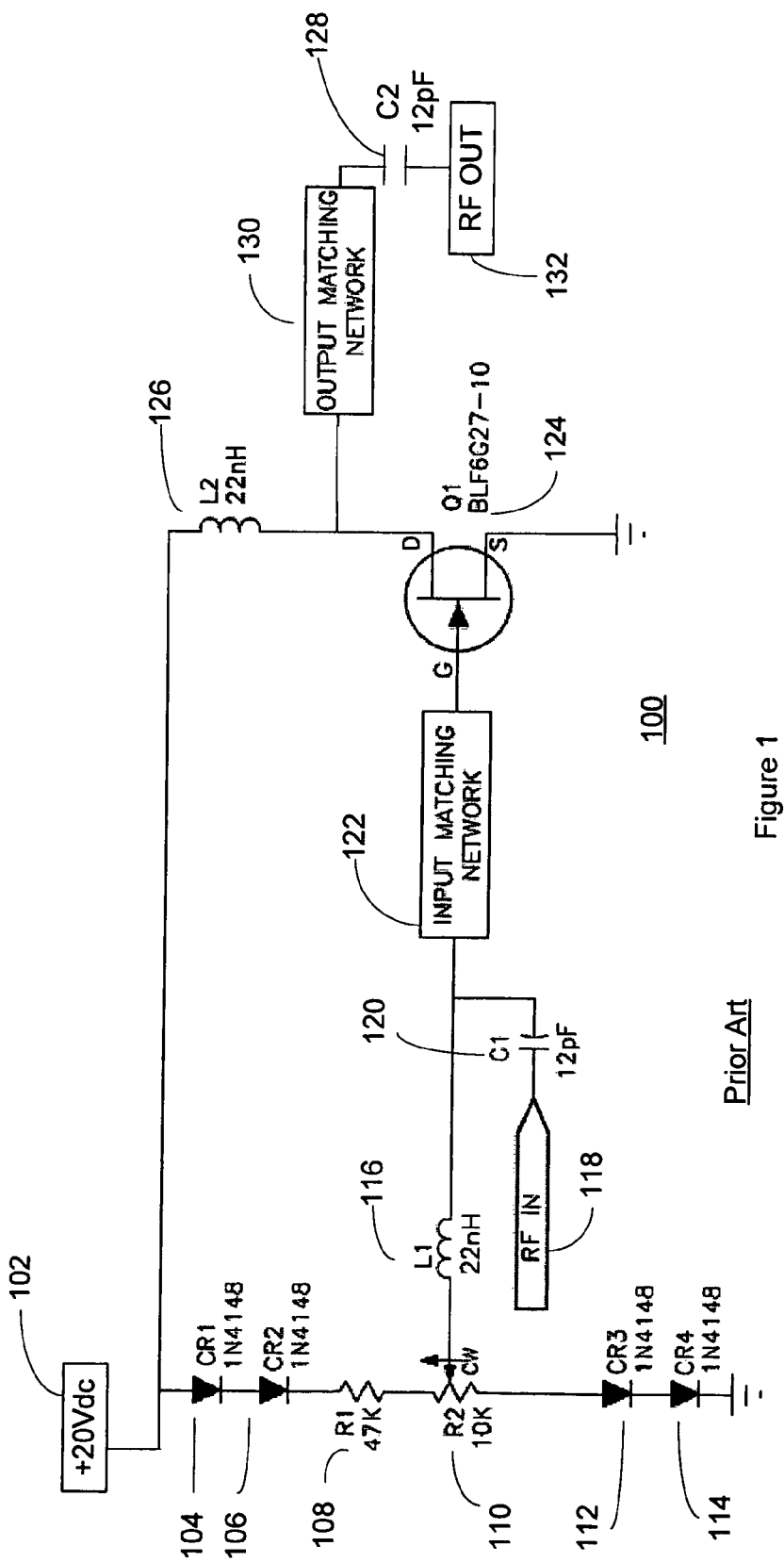
FIG. 1 is a schematic of a prior art LDFET-based Radio Frequency (RF) amplifier.

FIG. 1 illustrates a prior art Radio Frequency (RF) Amplifier 100 having a supply voltage of +20Vdc 102 and which receives an RF signal input 118 and outputs an amplified RF signal 132. Input Matching Network 122, which can include capacitors, inductors, resistors, and transmission lines, is designed to provide required impedance matching, harmonic attenuation, bandwidth and other operating characteristics for use at operating frequencies of circuit 100 and in particular in matching the power transistor Q1. This matching circuit may be calculated using mathematical models and simulation programs. In the circuit of FIG. 1 the gate of RF power transistor Q1 124 is biased by adjusting the potentiometer R2 110 to cause the desired quiescent drain current to flow. In this example, Q1 124 is a 10 Watt LDMOS (Laterally Diffused Metal-Oxide Semiconductor) power transistor for applications at frequencies between 2.5 and 2.7 GHz. For example, Q1 124 may be part number BLF6G27-10 supplied by NXP Semiconductors. In this example, diodes 104, 106, 112, 114 (CR1-4) are part number 1N4148 of NXP Semiconductors. By adding or removing diodes 104, 106, 112, 114 (CR1-4) in series with resistors 108 and 110 (R1 and R2), the gate voltage can be made to increase or decrease as a function of temperature, thereby compensating the drift of the gate threshold voltage with respect to temperature on an open loop basis. Determining the proper temperature compensation for each device requires several temperature cycles of up to four hours each. This is obviously a time-consuming procedure tying up expensive test equipment as well as an RF technician for many hours per amplifier. Moreover, in the end this does nothing to solve the other aspects of the gate drift problem.

The amplifier 200 of FIG. 2 solves the gate drift problem by providing a drain current or gate bias control circuit 201, including drain current sensing resistor R1 204, that senses the drain current Id 227 of Q2 228 and automatically adjusts the gate voltage Vg 229 to maintain drain current Id 227 independently of temperature, time, input drive, frequency, as well as from device to device variations. Q2 228, like Q1 124 of FIG. 1 above, is in this example a 10 W LDMOS or LDFET power transistor. With the circuit as shown, adjusting the potentiometer R3 208 from end to end will cause the drain current Id 227 to vary from 650 mA to 1.60 A and, once set, Id 227 will then remain essentially constant with respect to the above parameters. In this manner, a user may increase of decrease the setting of drain current Id 227 by adjusting the potentiometer R3. Assume a supply voltage of +20.0 VDC 202 and a forward drop over diode CR1 212 of 0.70 VDC. The cathode 213 of diode 212 will then be at a potential of 19.30 VDC. The purpose of diode 212 is to temperature compensate the base (B) to emitter (E) voltage (Vbe) of Q1 214. In this example, Q1 214 has part number 2N2907 of NXP Semiconductors, also known as PN2907, and is a bipolar transistor intended for low power amplifying or switching applications. The wiper 209 of potentiometer R3 208, which is connected to the base of Q1 214, will then allow adjustment from +18.98 VDC to +19.17 VDC. With the wiper 209 of potentiometer 208 centered, the base will be at +19.07 VDC. Assuming a Vbe of Q1 of 0.70 VDC, the emitter of Q1 will then be at +19.77 VDC. For Q1 emitter to be at +19.77 VDC, the drain of Q2 must draw 1.15 A (1.15 A×0.2 ohms=0.23 VDC=20 VDC−19.77 VDC). For this to happen, a current of approximately 1 mA must and will flow from the collector (C) of Q1 to develop sufficient voltage across resistor R6 226 to bring the gate of Q2 228 up to the voltage required to cause 1.15 Amps, Id 227, to flow through its drain.

Should Q2 228 attempt to draw more current, the base to emitter voltage (Vbe) of Q1 214 will be lowered, causing less current to flow to R6 226, causing the gate voltage to lower, thereby lowering the drain current Id 227 of Q2. The opposite is true should Q2 attempt to draw less drain current.

Inductors L1 218 and L2 230 act as RF chokes preventing RF power from reaching the collector of Q1 214 or the supply voltage 202. Capacitors C1 222 and C2 232 isolate the gate (G) and drain (D) of Q2 228 from a DC standpoint from the input and output matching circuitry, 224 and 234 respectively. Resistor R5 216 acting in concert with resistor R6 226 forms a voltage divider which prevents the collector (C) of Q1 214 from supplying excessive gate voltage to Q2 during "wake up." This initial "wake-up" transition or period may be in the context of the transistor operation or the overall circuit operation and may occur at initial start-up and/or at other periods during operation of the circuit or a circuit or system in which the amplifier is used. For instance, the overall circuit may be turned off or go into a "sleep" or "stand-by" mode of operation in power management to conserve energy and extend lifespan. The "wake-up" aspect of operation of either a transistor or a circuit is known by those skilled in the art of amplifier design and use.

FIG. 3 represents an optional thermal or temperature compensation circuit 300 for incorporation into the circuit of FIG. 2 as shown at connection nodes 301 and 302. The exemplary circuit of FIG. 3 includes two resistors 304 and 306 (R8, R9) and a thermistor 308 (R7) that are added to provide the opportunity to intentionally change the drain current Id 227 of Q2 228 as a function of temperature. It is often desirable to increase the drain current Id 227 as the temperature increases in order to maintain a constant output power. With the values shown, and the ambient current set to 1.15 Amps, this would increase to approximately 1.50 Amps at +70 C. However, when the drain current is allowed to change according to temperature, the function of the control circuit varies slightly. Whereas in FIG. 2 the control circuit's function is to draw a constant current at the drain, its function in FIG. 3 is to draw a constant current at the drain with respect to all parameters except for temperature. By allowing the drain current Id to vary according to temperature, a constant output can be maintained within a range of different temperatures. This advantage is not achieved in the first embodiment of the invention. In the example of FIG. 2, the gate bias control circuit 201 senses the drain current Id 227 of Q2 228 and automatically adjusts the gate voltage Vg 229 to maintain drain current Id 227 independently of temperature, time, input drive, frequency, as well as from device to device variations. Adjusting the potentiometer R3 208 causes the drain current Id 227 to vary from, e.g., 650 mA to 1.60 A and, once set, Id 227 will remain essentially constant. The temperature compensation circuit of FIG. 3 is used to introduce a change to separately adjust and manipulate operation of transistor Q1 214 to manipulate the gate voltage of LDFET Q2 228 so as to force more or less current to flow across the drain current sense resistor R1 204. This may be particularly useful in over-temperature situations when it is desirable to have greater current flowing during "hot" operation.

Figure 4:
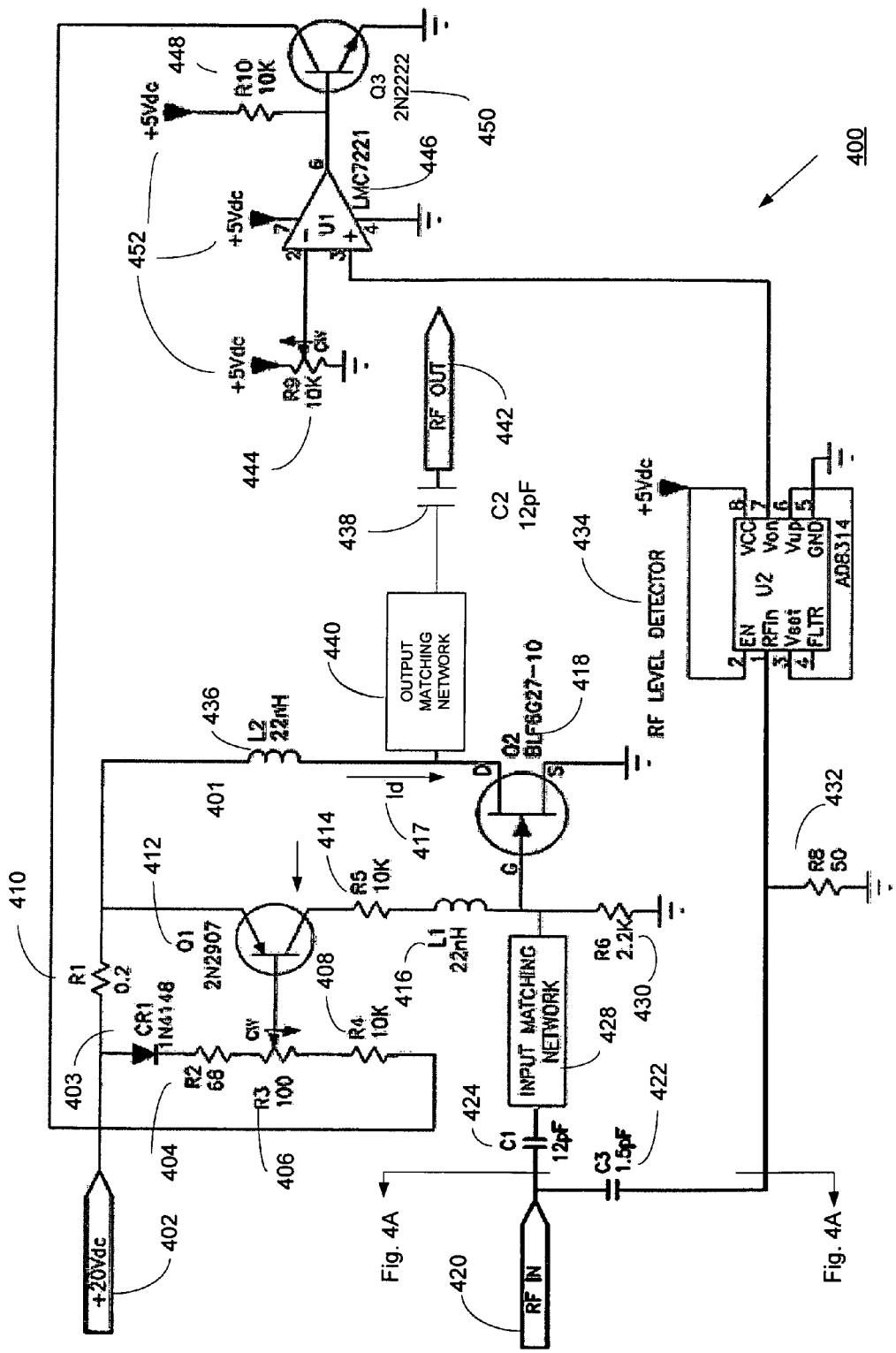
FIG. 4 is a variation of the amplifier of FIG. 2 having an RF power monitoring and drain current control circuit.

Although improved, the circuits of FIGS. 2 and 3 suffer the disadvantage of drawing the same drain current Id 227 whether or not there is any input RF power 220 present. To solve this disadvantage, the amplifier 400 of FIG. 4 includes an RF Level Detector, U2 434, which senses the input RF power 420 and presents a corresponding DC voltage to an input of a comparator, U1 446, which serves to turn on or shut off transistor Q2 based on a threshold reference voltage. In this manner amplifier 400 avoids unnecessary current flow and resulting undesired effects. RF Level Detector U2 434, in this example, is part number AD8314 as supplied by Analog Devices, Inc. and is a 50 dB dynamic range amplifier/conditioner used for transmitter power control and other applications. RF Level Detector U2 434 operates in the frequency range of 0.1 to 2.5 GHz and over a typical dynamic range of 50 dB. U2 434 is internally AC-coupled and has high sensitivity for control at low signal levels.

Figure 4A:
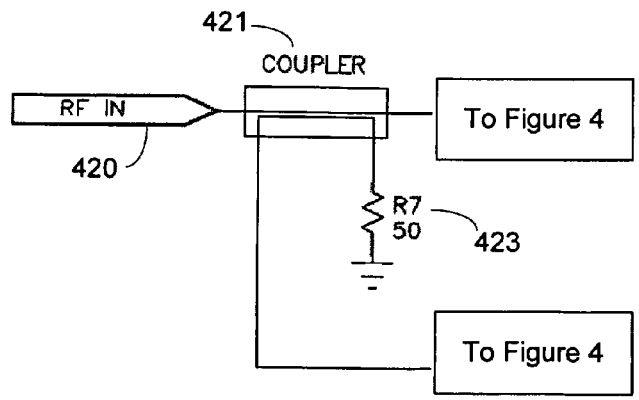
FIG. 4A is an alternative RF Input coupler arrangement for use in the circuit of FIG. 4.

RF IN 420 is connected to amplifier circuit 400 through capacitor C1 424 (e.g., 12 pF) to input matching network 428 and through capacitor C3 422 (e.g., 1.5 pF) to RFIn input of RF Level Detector 434. This simplified arrangement is particularly useful in narrow band applications. In one alternative, shown in FIG. 4A, RF IN 420 is connected to circuit 400 through coupler 421, which taps off some of the power flowing in the main RF path for use in a lower power path such as to drive a pre-scaler or in this case a level detector 434. Note that for narrow band applications the simplified arrangement of FIG. 4, small value capacitor rather than coupler of FIG. 4A, has the advantage of significantly reducing board space particularly as the operating frequency is reduced. For example at 2 GHz and a dielectric constant of 3.5 and a board thickness of 20 mils, the coupler trace would be approximately 0.860" in length and 0.140" in width. At 400 MHz, the trace length would increase to 4.30" with the same width. By comparison a 0402 capacitor occupies an area of 0.04"×0.02". The disadvantage of the simplified capacitor arrangement is that the amount of coupled energy becomes a function of frequency–$Zc=1/(2\pi \times F \times C)$. Since the F term (frequency) is in the denominator, the Zc decreases as frequency increases thereby increasing the coupled energy. With consideration of this trade-off, either arrangement may be used in the circuits of FIGS. 4-13.

By way of coupler 422 (FIG. 4A), such as physical traces on a circuit board, or through capacitor C3 422 (FIG. 4) a portion of the RF power is connected to input 1 (RFin) of U2 434 which acts as an RF level detector and presents a corresponding DC voltage to the input 3 of comparator U1 446, for example a micro-power CMOS comparator available from National Semiconductor by part number LMC7221. Both U1 446 and U2 434 are connected to a reference voltage +5Vdc 452. The input 2 of the comparator U1 446 connects to potentiometer R9 444 which is adjusted to the desired input threshold RF power. Below this threshold the circuit draws only the current that is required by U1 446 and U2 434. Above the threshold the circuit performs essentially as the circuit of FIG. 2. The output 6 of U1 446 is connected to the base of transistor Q3 450, a general purpose transistor having part number 2N2222 or PN2222. The collector of Q3 450 is connected through resistor R4 408 to the potentiometer R3 406 which is connected to the base of bipolar transistor 412, which is part of drain current control circuit 401, similar to drain current control circuit 201 discussed above. In this manner, the combination of U1 446 and transistor Q3 450 control the base (B) to emitter (E) voltage (Vbe) of transistor Q1 412 below the set threshold so as to shut off the flow from the collector of Q1 412. This removes the voltage across resistor R6 430 thereby shutting off the drain current, Id 417, in Q2 418.

Figure 5:
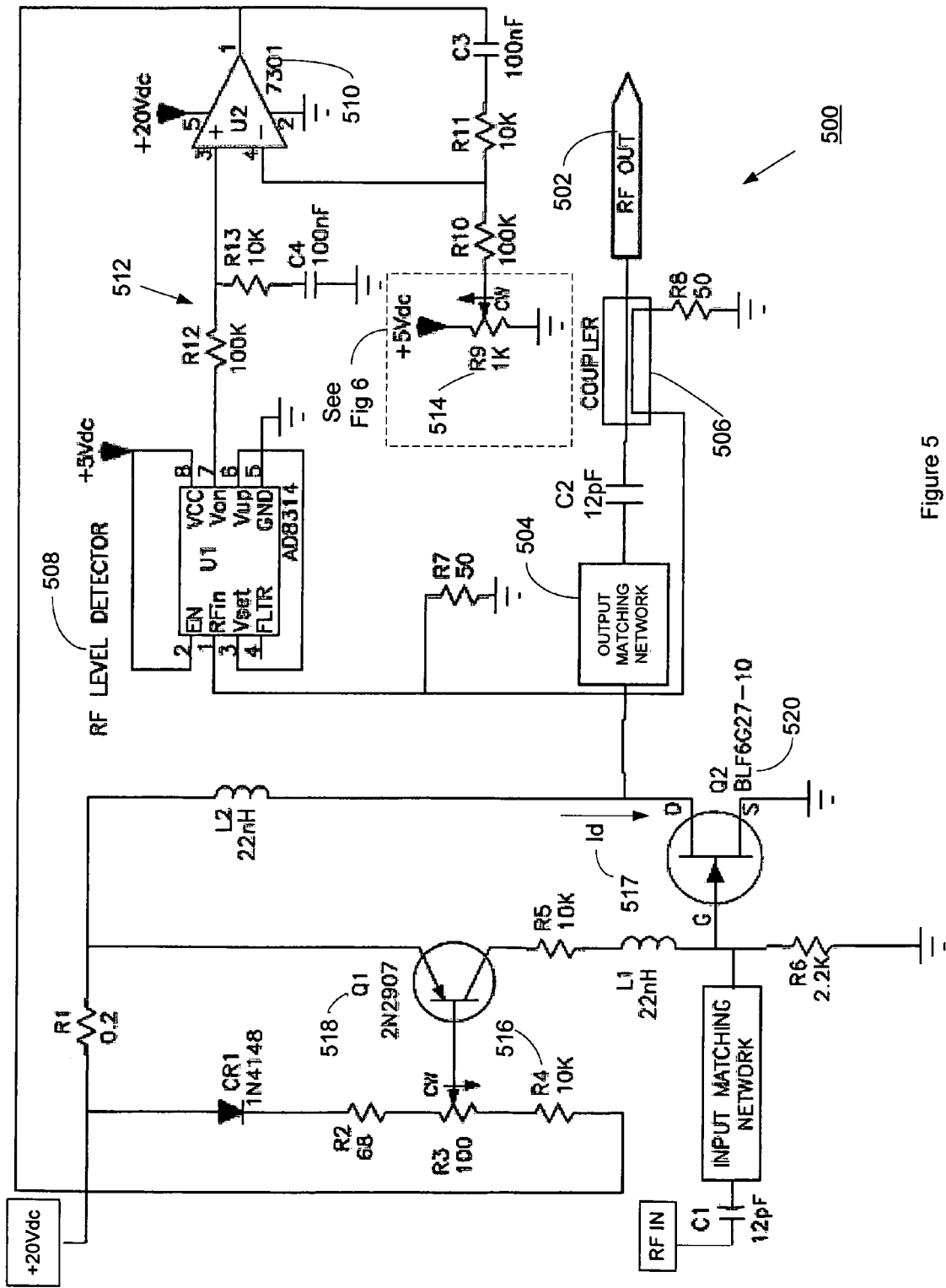
FIG. 5 is a variation of the amplifier of FIG. 2 having an RF output power leveling circuit.

The amplifier 500 of FIG. 5 includes an RF power leveling aspect. In operation, the output RF power 502 is output from Output Matching Network 504 through coupler 506, which is connected via input 1 (RFin) of integrator U1 508. In this manner, U1 508 senses the RF OUT and outputs at output 7 (Von) a corresponding DC voltage which is delivered to input 3 of integrator U2 510 by way of circuit 512. U2 510 in this example is a low power operational amplifier having part number LM 7301 as provided by National Semiconductor Corporation. By comparing this voltage with a preset voltage from potentiometer R9 514 the output of the integrator U2 510 will increase or decrease the voltage to resistor R4 516 to control operation of transistor Q1 518 so as to cause the drain current Id 517 associated with transistor Q2 520 to increase or decrease as required to maintain an essentially constant output RF power 502.

Figure 6:
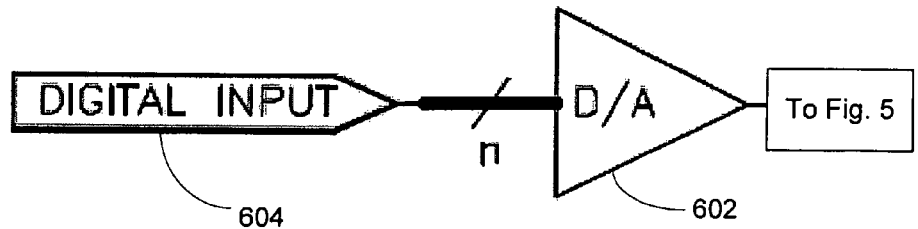
FIG. 6 is an optional digital input circuit for use with the RF output power leveling circuit in the amplifier of FIG. 5.

The circuit of FIG. 6 is an optional substitute circuit for use in the circuit of FIG. 5. FIG. 6 shows a digital to analog convertor 602 that is used in place of R9 514 thereby permitting the RF output power to be controlled by a computer command.

Figure 7:
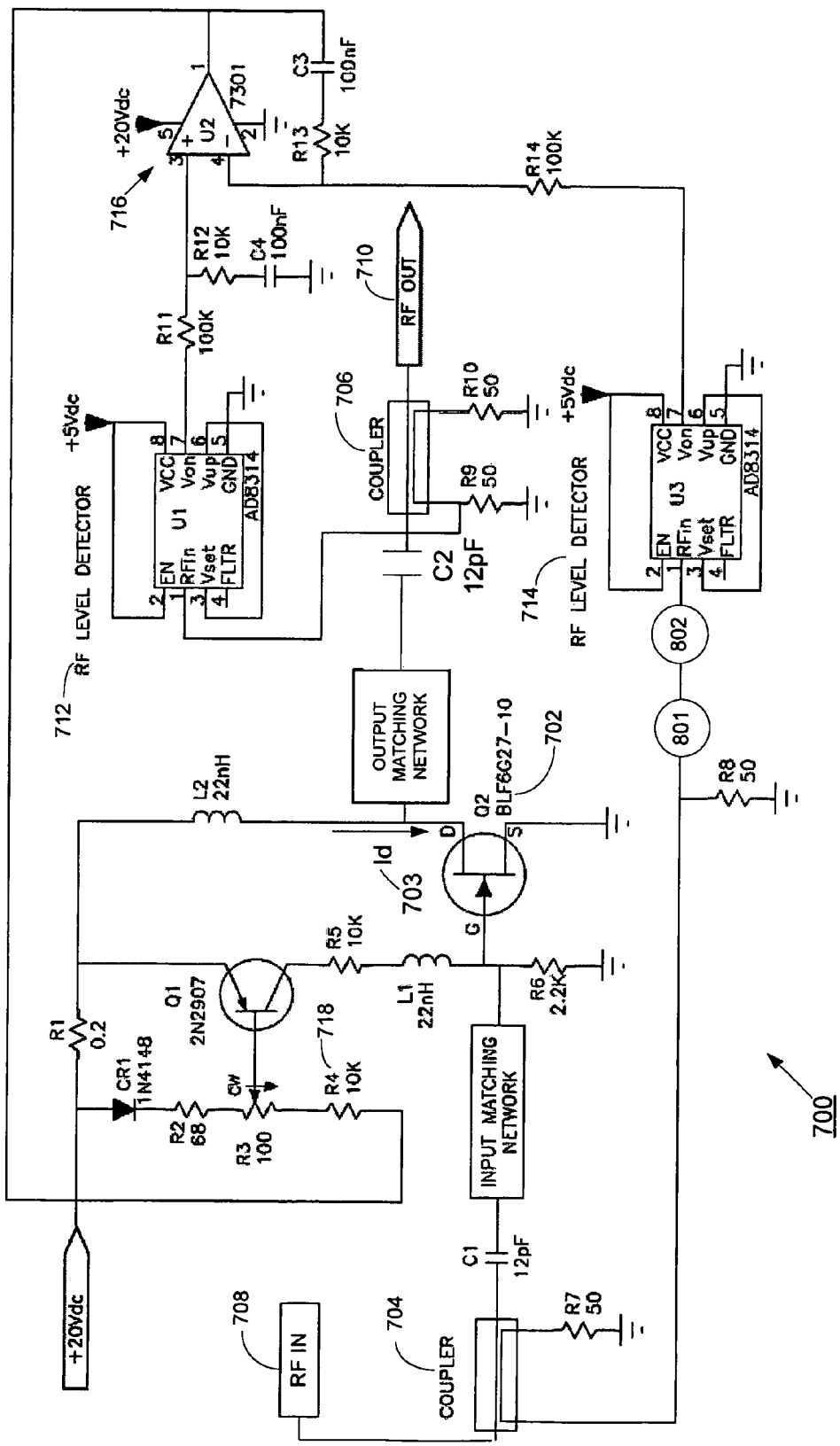
FIG. 7 is a variation of the amplifier of FIG. 2 having high power gain block configuration.

FIG. 7 illustrates an alternative amplifier 700 in which transistor Q2 702 operates as a high power gain block—the gain being determined by the ratio of the coupling coefficients of the output to input couplers 704/706. The input and output RF levels 708/710 are measured by RF Level Detectors U3 714 and U1 712 respectively. The outputs Von of RF Level Detectors U1 712 and U3 714 are delivered, respectively, to inputs 3 and 4 of integrator U2 716. The output 1 of U2 will in turn increase or decrease the voltage to resistor R4 718 causing the drain current Id 703 to increase or decrease as required cause the correct amount of current to flow through Q2 702 to cause the two inputs to equalize and maintain a constant output RF power.

If, for example, the input and output couplers 704/706 have coupling coefficients of 10 dB and 15 dB respectively, the overall circuit will exhibit a gain of 5 dB. One major advantage of this design over prior designs is that unlike conventional gain blocks, the drain current Id 703 varies according to the output power required to maintain a constant gain.

Figure 8:
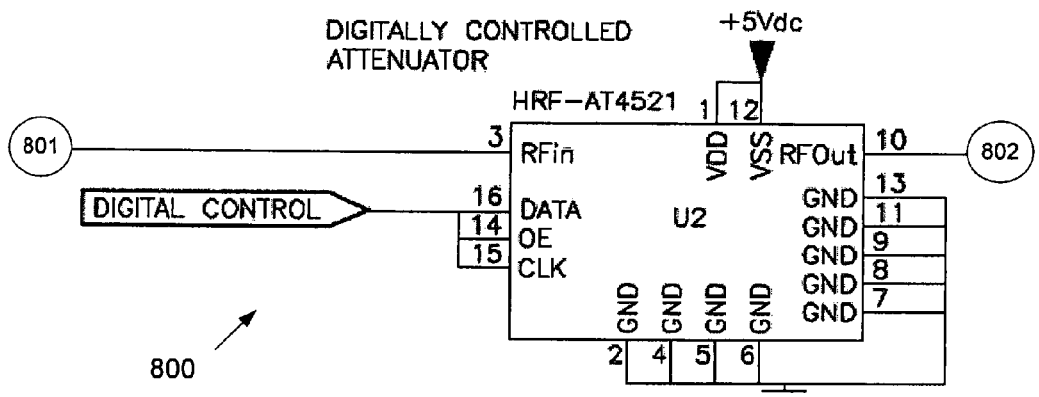
FIG. 8 is an optional digital attenuator for digital control for use with the high gain block variation of FIG. 7.

FIG. 8 is a schematic of an optional digital attenuator 800 placed in the input 1 (RFin) of the input power detector 714 of FIG. 7 as indicated at nodes 801 and 802. With the optional digital attenuator, amplifier 700 still performs as a gain block but with the added feature of selectable gain and also retains the advantage of drawing only that current Id 703 required to maintain the desired gain. While the gain is based in part on the coupling coefficients of couplers 704 and 706, the digital attenuator allows for programmable or selectable gain to adjust the actual gain achieved. In this example, attenuator 800 is part number HRF-AT4521 as made by Honeywell International Inc. and is a 31.0 dB, DC-2.5 GHz, DC-coupled, 50 ohm impedance 5 Bit Serial Digital Attenuator. In operation, a serial digital word such as received from a system control unit, is input to a register contained within this attenuator. This stored digital word then sets the attenuation ratio until a new word is received or DC power is cycled.

Figure 9:
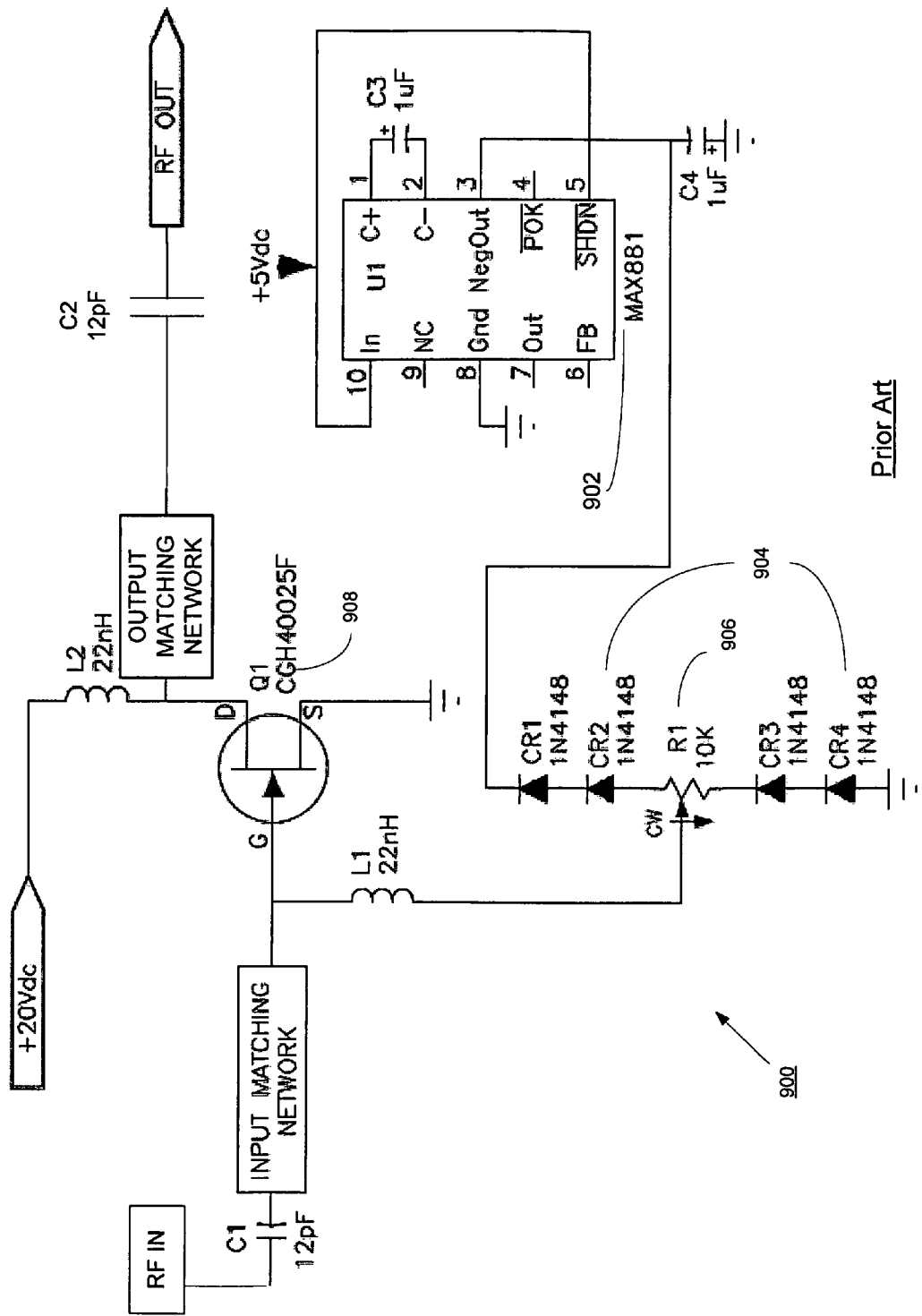
FIG. 9 is a schematic of a prior art GaNFET-based amplifier.

With reference to FIG. 9, a recent transistor technology is that of Gallium Nitride Field Effect Transistor (GaNFET), such as transistor Q1 902, which has among its advantages higher operating voltage, higher temperature operation, higher efficiency, and higher frequency operation than LDFETs. Both the GaNFET Q1 of FIG. 9 and the LDFET Q2 of FIG. 2 are positive sense with respect to the gate voltage in that a more positive (or less negative in the case of GaNFET) voltage on the gate results in higher drain current. While a typical gate voltage on a LDFET may be in the +1 to +2VDC range, the gate on a GaNFET will normally operate in the −2 to −1VDC range. This applies equally to GaAs FETs and JFETS for that matter. GaNFET transistors have similar gate drift problems as LDFETs, but as stated above they have the further complication of a negative gate voltage requirement. In many situations, such as in airborne applications, it is unusual to have a negative voltage available. To satisfy the negative voltage requirement, prior circuits such as FIG. 9 used a negative voltage driver IC such as the Maxim Semiconductor MAX881 (U1) 902. The output 3 (NegOut) of this device is presented to diodes CR1-4 904 and potentiometer R1 906 connected in series. Much like the LDFET prior art as discussed above, prior GaNFET transistor circuits used a similar approach of adding or removing diodes to accomplish temperature compensation for the threshold voltage on an open loop basis. Again, one problem with this solution is that the temperature compensation procedure is very labor and equipment intensive. Another problem is that U1 902 includes a square wave oscillator which causes spurious responses on the output of GaNFET power transistor Q1 908. In this example Q1 908 is a 25 W, RF Power GaNFET with part number CGH40025F as manufactured by Cree, Inc. There are many such devices available along with publicly available application notes expressing techniques concerning how to minimize such spurs.

Figure 10A:
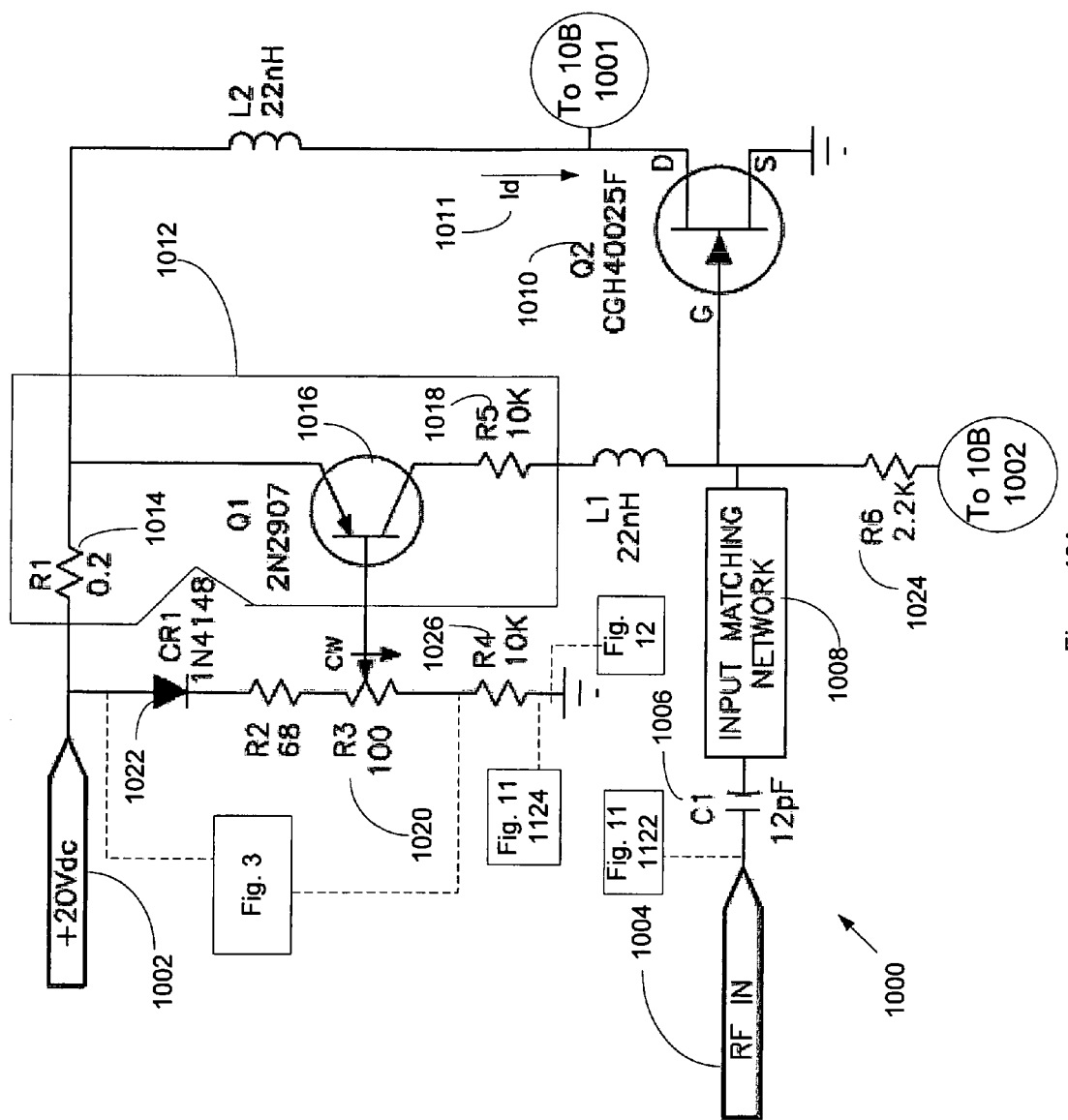
FIG. 10A is a schematic of a first half of a first embodiment of a GaNFET-based amplifier of the present invention with gate bias circuit for connection with the remaining circuitry of FIG. 10B.
Figure 10B:
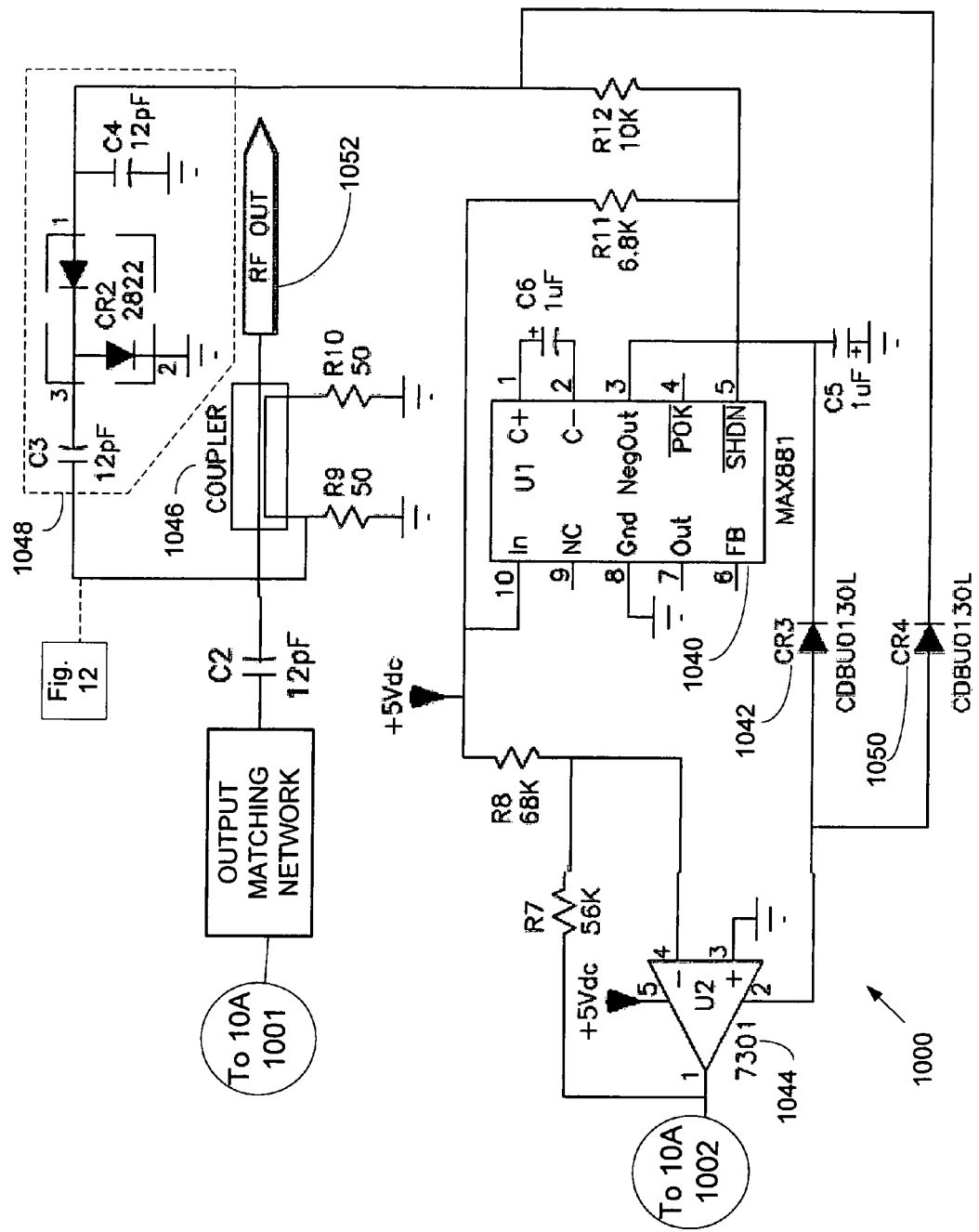
FIG. 10B is a schematic of a second half of a first embodiment of a GaNFET-based amplifier of the present invention with gate bias circuit for connection with the remaining circuitry of FIG. 10A.

With reference to FIGS. 10A and 10B, one of the advantages of the GaNFET amplifier 1000 over prior circuits is that it does not attempt to minimize the spurious responses caused by the negative voltage deriver IC by better decoupling or improved grounding or any of the other techniques shared in the application notes. Rather, amplifier 1000 eliminates the problem entirely by shutting down the oscillator 1040 once it is no longer needed. In general, the oscillator of negative voltage driver U1 1040 is only needed momentarily as a "starter" for a few milliseconds, i.e., long enough for transistor Q2 1010 to come to life. To avoid the undesired effect of the spurious oscillator signal of the negative voltage driver U1 1040, the invention shuts down the driver after start up and relies on the RF output transistor Q2 itself to maintain operating conditions. The RF on the drain of Q2 1010 generates and provides the negative supply for the transistor. Once the transistor Q2 1010 "comes to life" and self supplies the negative gate voltage then the negative voltage driver 1040 shuts down and in this manner the amplifier 1000 removes the spurious oscillator signal of the driver 1040.

Amplifier 1000 is connected to supply voltage 1002 (+20VDC) and receives RF IN 1004 which is connected to the gate of transistor Q2 through capacitor 1006 and input matching network 1008. In this example, transistor Q2 1010 is a GaNFET having part number GCH40025F, as described above. Referring to FIG. 10B, negative voltage driver U1 1040 as connected generates approximately −5.0 VDC at output 3 (NegOut). This voltage then passes through Schottkey diode CR3 having part number CDBU0130L, such as made by Discrete Semiconductor Products, to present −4.6 VDC to the negative supply (input 2) of operational amplifier U2 1044. U2 1044, as connected at node 1002, then presents a regulated −4.5 VDC to resistor R6 1024. The key is to configure the circuit so that the level is more negative than the level required to shut down Q2 1010. The gate bias circuit 1012 includes drain current sensing resistor R1 1014, bipolar PNP transistor 1016 (connected to potentiometer R3 1020), and resistor R5 1018 and operates much as does the LDFET gate bias circuit 201 described above except in the case of the GaNFET gate bias circuit the voltage increases to the value required by starting from a negative potential rather than from ground (as in the case of the LDFET bias circuit 201). In both cases the sense is positive, i.e., increasing voltage on the transistor gate, in this case of transistor Q2 1010, causes an increase in drain current, in this case drain current Id 1011.

The shutoff function is accomplished by a coupler 1046 which pulls a fraction of the RF power present at the drain of Q2 1010 and presents this power to the input of the negative voltage deriver 1048, comprised of capacitors C3 and C4 and diode pair CR2 (part number 2822), operating at the carrier frequency. This detected negative voltage is then presented to the negative supply (pin 2) of U2 1044 through CR4 1050. In addition, this negative voltage is connected to resistor R12 which in conjunction with resistor R11 are connected to pin 5 (SHDN) of U1 1040 and causes the oscillator section of U1 to shut down. U1 1040 then in effect acts as a starter, i.e., it operates only long enough for the amplifier U2 1044 to begin delivering RF power and then automatically shuts off thereby eliminating spurs caused by its internal oscillator.

The remainder of the circuitry in FIG. 10 acts similarly to that of FIG. 2 in that as the gate voltage is increased (less negative), the current in the drain of Q2 increases until an equilibrium point is reached.

The various improvements described above and shown in relation to FIGS. 3-8 as relating to the LDFET implementation of the invention also may be applied in the context of GaNFET implementation of FIGS. 10A-10B. The optional temperature compensation circuit 300 described above for incorporation into the amplifier 200 of FIG. 2 (as shown at connection nodes 301 and 302) may also be included to the amplifier 1000 at the same location in the circuit as shown in FIG. 10A. Also, as described above in the LDFET implementation of FIG. 4, the circuit of FIG. 11 may optionally be included with the amplifier 1000 of FIG. 10A to overcome the disadvantage of drawing the same drain current Id 1011 whether or not there is any input RF power 1004 present. Connection points are shown on FIG. 10A with hatched lines. As with FIG. 4, the circuit of FIG. 11 includes an RF Level Detector, integrator U2 1134, that senses the input RF power 1004 and a comparator, U3 1146, that serves to shut off the drain current Id 1011 of Q2 1010 of FIG. 10A based on a threshold reference voltage. In this manner the amplifier 1000 avoids unnecessary current flow and resulting undesired effects.

Figure 12:
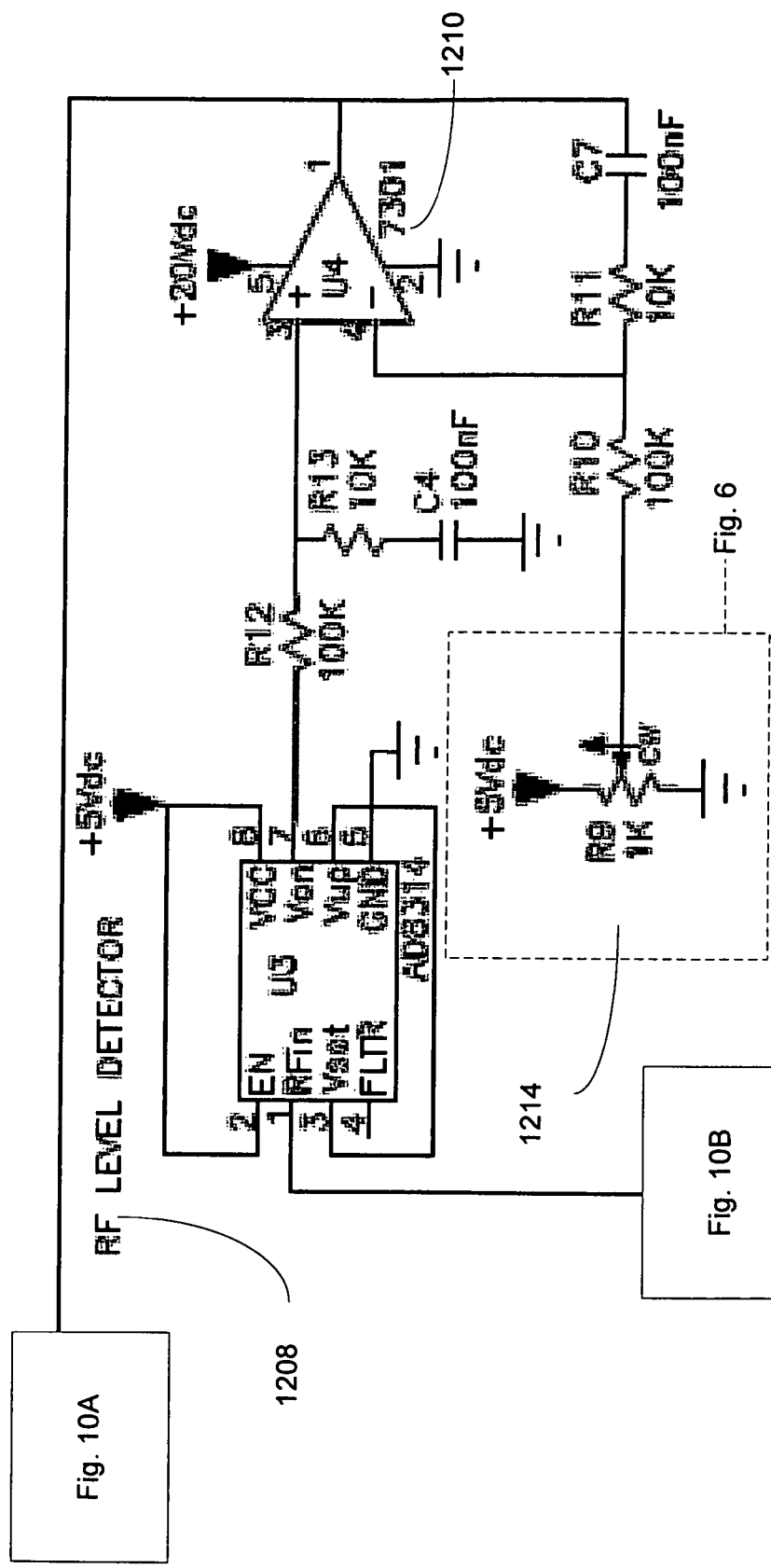
FIG. 12 is a schematic of an RF output power leveler circuit for use with the amplifier of FIGS. 10A/10B.

Also, as described above in the LDFET implementation of FIG. 5, the circuit of FIG. 12 may optionally be included with the amplifier 1000 of FIGS. 10A/10B. As described for the amplifier 500 of FIG. 5, the circuit of FIG. 12 includes an RF power leveler aspect. In operation, the output RF power 1052 is output from the Output Matching Network through coupler 1046, which is connected via input 1 (RFin) of integrator U3 1208. In this manner, U3 1208 senses the RF OUT 1052 and outputs at output 7 (Von) a corresponding DC voltage which is delivered to input 3 of integrator U4 1210 by way of circuit R12, R13, and C4. By comparing this voltage with a preset voltage from potentiometer R9 1214 the output of the integrator U4 1210 will increase or decrease the voltage to resistor R4 1026 of FIG. 10A to control operation of transistor Q1 1016 so as to cause the drain current Id 1011 associated with transistor Q2 1010 to increase or decrease as required to maintain an essentially constant output RF power 1052.

As shown by the hatched lines on FIG. 12, the circuit of FIG. 6, as described above, is an optional substitute circuit for use in the circuit of FIG. 12 and amplifier 1000 of FIGS. 10A/10B. FIG. 6 shows a digital to analog convertor 602 that is used in place of R9 1214 thereby permitting the RF output power to be controlled by a computer command.

In addition, the alternative circuit of FIG. 7, as implemented in conjunction with LDFET amplifier 700, may be employed in conjunction with GaNFET-based amplifier 1000 of FIGS. 10A/10B. The operation of transistor Q2 1010 of FIG. 10A as a high power gain block is similar to the operation of Q2 702 of FIG. 7 described above. Also, the optional digital attenuator 800 of FIG. 8 may be included in the circuit for operation with the GaNFET amplifier 1000 of FIG. 10A in the same manner as described above in the context of LDFET-based amplifier 700 of FIG. 7. With the optional digital attenuator, amplifier 1000 still performs as a gain block but with the added feature of selectable gain and also retains the advantage of drawing only that current Id 1011 required to maintain the desired gain.

Figure 11:
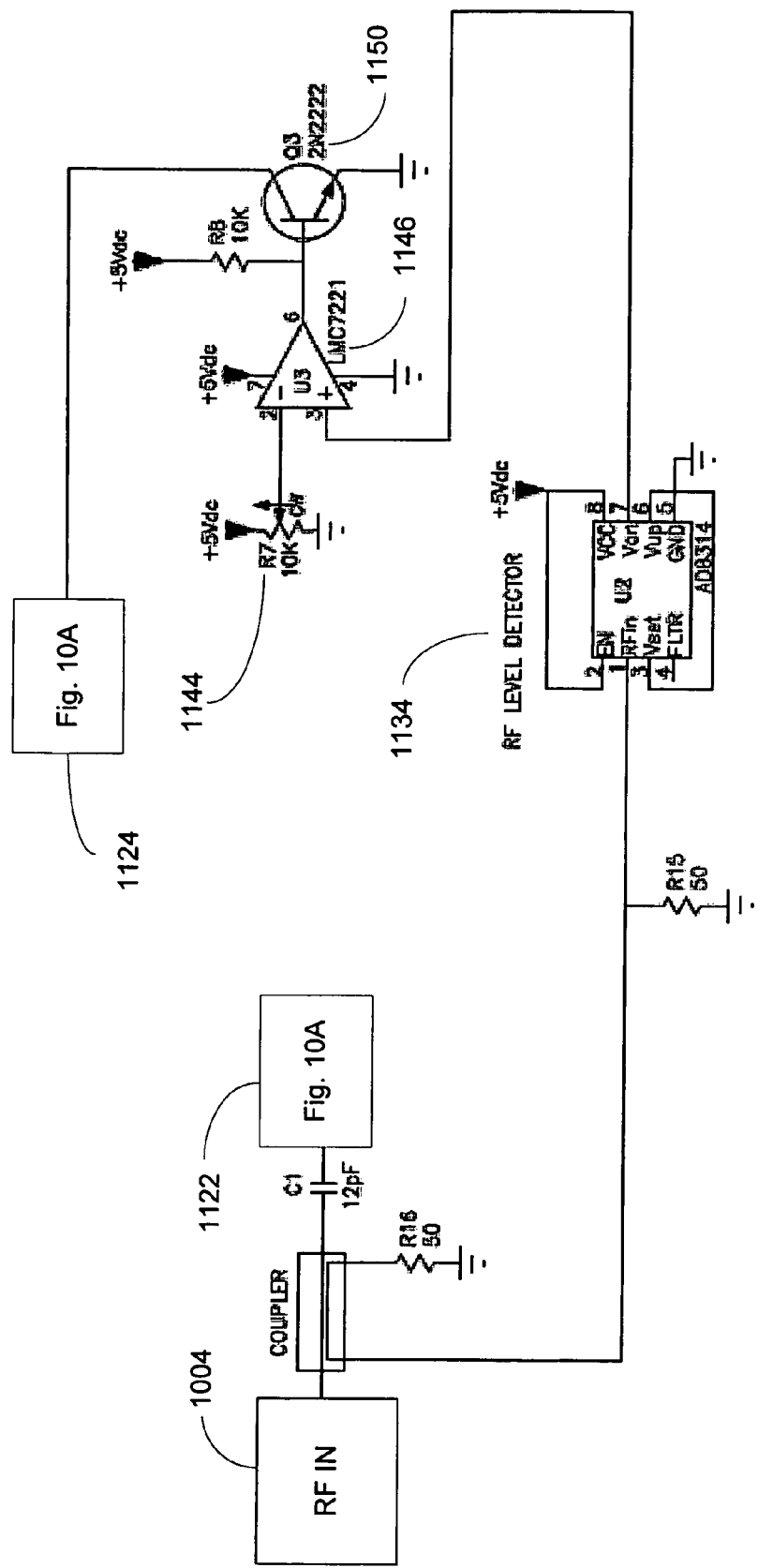
FIG. 11 is a schematic of an RF power monitoring and drain current control circuit for use with the amplifier of FIGS. 10A/10B.

These circuits thus far described, including specifically FIGS. 10-12 related to GaNFET embodiments, also operate with other negative voltage gate devices such as N-Channel Junction Field Effect Transistors (JFET) and Gallium Arsenide Field Effect Transistors (GaAsFETS).

The present invention is intended for many uses and applications including in design and manufacture of airborne and ground-based telemetry equipment. Telemetry systems comprise transmitters, receivers, and power amplifiers in a wide variety of frequency ranges. Although many aspects of the various embodiments of the invention are described in the analog domain it should be understood that this is for purposes of explaining the invention and that the invention may be used in conjunction with digital processing devices and techniques including the use of microprocessors, memory, etc.

Figure 13A:
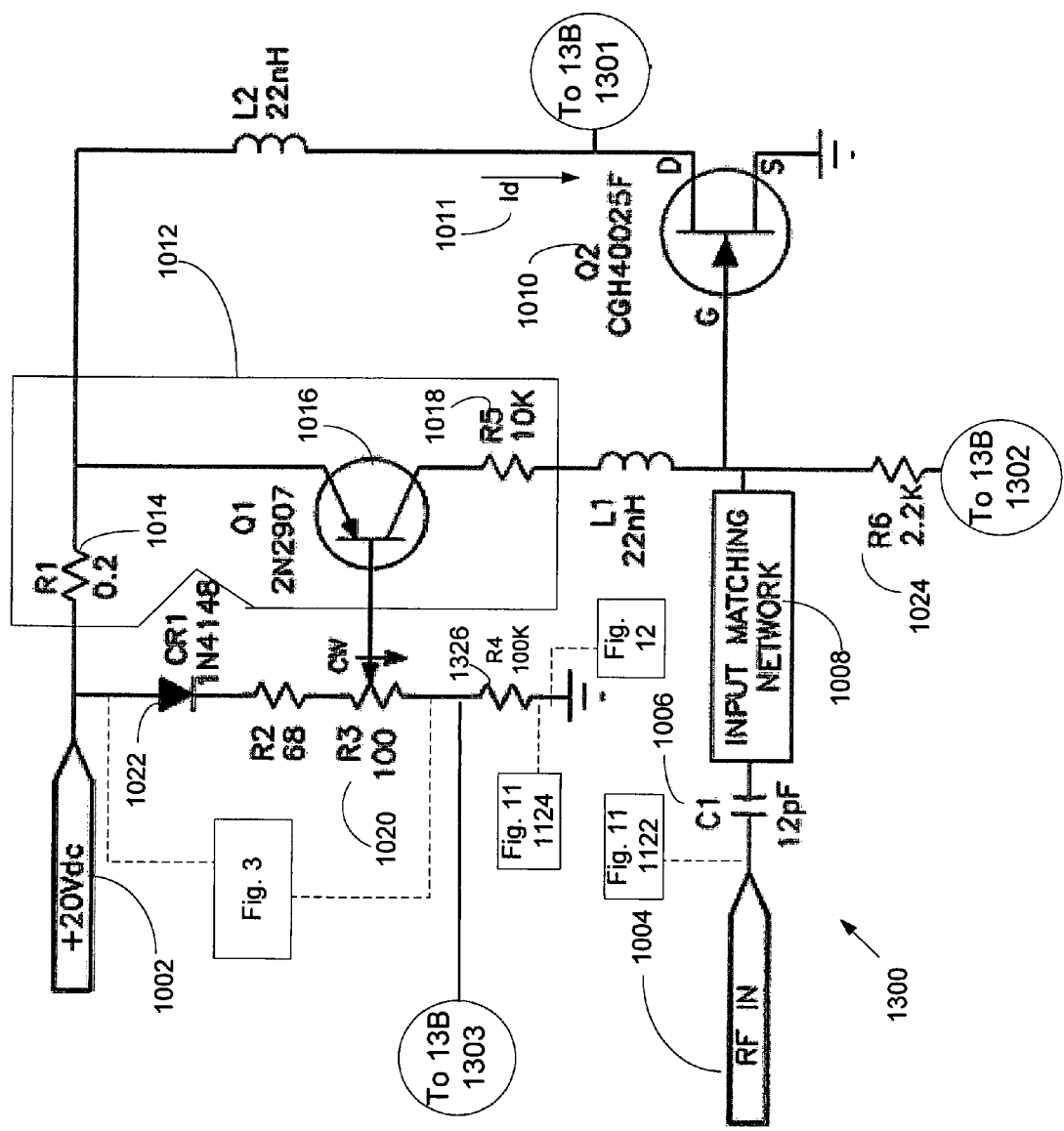
FIG. 13A is a schematic of an alternative second embodiment of a GaNFET-based amplifier of the present invention with gate bias circuit for connection with the remaining circuitry of FIG. 13B.

FIGS. 13A/13B illustrate an alternative embodiment that corresponds to the GaNFET-based amplifier of FIGS. 10A/10B. With reference to FIG. 13B, as described in detail above in the context of FIG. 10B the output of the dual diode-based negative voltage deriver 1048 provides a voltage source for the bias circuit. In addition, the output of the negative voltage deriver 1048 provides a crude measure of the output power. By adding resistors 1313 (R13) and 1314 (R14), and transistor 1310 (Q3) to the previous circuit of FIGS. 10A/10B, drain current 1011 will vary to supply only the current required to deliver that output power. In this regard, this circuit will perform similarly to a Class H amplifier except drain current is modulated rather that drain voltage. Class H amplifiers operate with infinitely variable supply rails. This is done by modulating the supply rails so that the rails are only a few volts larger than the output signal at any given time. Switching regulator power supplies are commonly used to create the tracking rails. The problem with Class H amplifiers is that switching regulators have notoriously low bandwidth, usually sufficient only for audio frequencies. The circuit of the invention on the other hand can operate well into the MHz range and is a far simpler and less expensive implementation.

In accordance with this alternative design, the exemplary 10K ohm resistor 1026 of FIG. 10A is replaced with a 100 K ohm resistor 1326 in the circuit of FIG. 13A. In operation, a small current through resistor 1326 (R4) results in a residual drain current in transistor 1010 (Q2) sufficient only to keep it "alive" or "active" and capable of amplifying. As a RF signal is applied to the RF input 1004 (FIG. 13A), this signal is amplified and a negative voltage is generated at the output of the dual diode detector CR2. Transistor 1310 (Q3) then begins conducting thereby lowering the voltage at the base of transistor 1016 (Q1), causing more drain current to flow through transistor 1010 (Q2). Note that this drain current will only be sufficient to generate the output power as determined by the level on input power and the gain of Q2. Resistor 1314 R14 prevents Q2 from excessive drain current by limiting the extent to which the base of Q1 can be lowered in voltage due to Q3 entering saturation should the dual diode detector/resistor 1313 R13 combination call for excessive current. This circuit thereby protects RF transistor from damage.

With continuing reference to FIG. 13B, the negative regulated voltage at the output of amplifier 1044 (U2) can optionally be provided to subsequent amplifier stages so that the circuitry of FIG. 13B would not need to be repeated resulting in significant efficiencies. As shown in FIG. 13B, the base of transistor Q3 may be connected to ground. Alternatively, and as shown in FIG. 13C, the base of Q3 may be connected to the circuit comprising +5 Vdc through 10 K ohm resistor 1315 (R15) diode 1316 (CR5) to ground.

The present invention is not to be limited in scope by the specific embodiments described herein, It is fully contemplated that other various embodiments of and modifications to the present invention, in addition to those described herein, will become apparent to those of ordinary skill in the art from the foregoing description and accompanying drawings. Thus, such other embodiments and modifications are intended to fall within the scope of the following appended claims. Further, although the present invention has been described herein in the context of particular embodiments and implementations and applications and in particular environments, those of ordinary skill in the art will appreciate that its usefulness is not limited thereto and that the present invention can be beneficially applied in any number of ways and environments for any number of purposes. Accordingly, the claims set forth below should be construed in view of the full breadth and spirit of the present invention as disclosed herein.

What is claimed is:

1. An RF amplifier circuit comprising:
    FET for receiving a RF input signal and generating an amplified RF output signal, the FET having a gate, drain, and source;
    control circuit, connected to the gate and drain of the FET, for controlling the current at the drain;
    bias circuit comprising a means for biasing and variably compensating drift in the gate threshold voltage required to set the quiescent drain current, the bias circuit being connected to the control circuit and controlling operation of the control circuit to maintain an essentially constant drain current;
    compensation means adapted to effect a change in drain current based at least in part on temperature variation to maintain essentially constant output power;
    whereby the control circuit maintains essentially constant drain current with respect to time, input drive, frequency, and device-to-device variations, while allowing the compensation means to alter drain current with respect to temperature variations.

2. The circuit of claim 1 further comprising a sensing means, connected to the control circuit, for sensing change in temperature, and wherein the compensation means automatically adjusts the drain current based at least in part on temperature fluctuation to maintain essentially constant output power with respect to temperature throughout RF amplifier operation.

3. The circuit of claim 2, wherein a thermistor comprises both the sensing means and the compensation means.

4. The circuit of claim 1, further comprising:
detecting means, connected to the RF input signal, for detecting the power level of the RF input signal and supplying a DC voltage representative of the detected power level;
means for producing a variable reference voltage;
comparing means, having an input for receiving the variable reference voltage and being operably connected to the detecting means, for comparing the supplied DC voltage to the variable reference voltage; and
switching means, connected to the comparing means and the bias circuit, for turning off the FET based at least in part on a comparison of the supplied DC voltage and the variable reference voltage.

5. The circuit of claim 4 wherein disposed intermediate of the RF input signal and the detecting means is one or more of a group consisting of a capacitor and a coupler.

6. The circuit of claim 1, further comprising:
detecting means, connected to the RF output signal of the circuit, for detecting the level of the output signal and supplying a DC voltage representative of the detected output signal level;
means for producing a variable reference voltage; and
adjusting means, operably connected to the detecting means, the variable reference voltage and the bias circuit, for automatically adjusting the drain current based at least in part on a comparison of the supplied DC voltage and the reference voltage to maintain essentially constant output RF power.

7. The circuit of claim 6 wherein disposed intermediate of the RF output signal and the detecting means is one or more of a group consisting of a capacitor and a coupler.

8. The circuit of claim 6, further comprising:
digital reference voltage generator adapted to produce and output a digital signal representing the reference voltage; and
digital-to-analog convertor having an input for receiving the digital signal, and an output connected to the adjusting means for supplying a computer-controllable analog reference voltage signal to the adjusting means.

9. The circuit of claim 1, further comprising:
first detecting means, connected to the RF input signal of the circuit, for detecting the power level of the input signal and supplying a first DC voltage representative of the detected input signal level;
second detecting means, connected to the RF output signal of the circuit, for detecting the level of the output signal and supplying a second DC voltage representative of the detected output signal level; and
adjusting means, connected to the first detecting means, the second detecting means and the bias circuit, for automatically adjusting the drain current based at least in part on a comparison of the second supplied DC voltage and the first supplied DC voltage by an amount necessary to maintain an essentially constant gain.

10. The circuit of claim 9 wherein disposed intermediate of the RF input signal and the detecting means is one or more of a group consisting of a first capacitor and a first coupler, and wherein disposed intermediate of the RF output signal and the detecting means is one or more of a group consisting of a second capacitor and a second coupler.

11. The circuit of claim 9, further comprising a digital attenuator, connected to the RF input signal and the first detecting means, for adjusting a gain of the circuit.

12. The circuit of claim 1, further comprising:
means for producing a negative voltage signal;
voltage regulator having an input and an output, the input operably connected to the negative voltage producing means and the drain of the FET, the output operably connected to the gate of the FET, the voltage regulator adapted to supply a regulated negative voltage signal to the gate of the FET; and
shutdown means, operably connected to the negative voltage producing means, for shutting down the negative voltage producing means after a wake-up transition;
whereby the voltage regulator supplies a regulated negative voltage signal to the gate of the FET both during and after the wake-up transition.

13. The circuit of claim 12, wherein the voltage regulator comprises: an inverting amplifier comprising an operational amplifier, the negative supply of the operational amplifier being operably connected to the negative voltage producing means and the gate of the FET.

14. The circuit of claim 1, wherein the biasing means comprises a variable resistance device adapted to selectively adjust the drain current independently of temperature variation.

15. The circuit of claim 1, wherein the FET is one of a group consisting of LDFET, GaNFET, GaAsFET, JFET, and MOSFET.

16. A method comprising:
receiving by a FET a RF input signal and generating an amplified RF output signal, the FET having a gate, drain, and source;
controlling the current at the drain by biasing and variably compensating drift in the gate threshold voltage required to set the quiescent drain current to maintain an essentially constant current at the drain in connection with a wake-up transition; and
based at least in part on temperature change, automatically altering the drain current to maintain essentially constant output power with respect to temperature;
maintaining essentially constant drain current with respect to time, input drive, frequency, and device-to-device variations, while allowing a change in drain current with respect to temperature variations.

17. The method of claim 16 further comprising selectively adjusting the drain current independently of temperature change.

18. The method of claim 16, further comprising:
detecting a power level of the RF input signal and supplying a DC voltage representative of the detected power level;
producing a variable reference voltage;
comparing the supplied DC voltage to the variable reference voltage; and
turning off the FET based at least in part on the comparing step.

19. The method of claim 16, further comprising:
detecting the power level of the output signal and supplying a DC voltage representative of the detected output power level;
producing a variable reference voltage; and
automatically adjusting the drain current based at least in part on a comparison of the supplied DC voltage and the reference voltage to maintain essentially constant output RF power.

20. The method of claim 16, further comprising:
detecting the power level of the input signal and supplying a first DC voltage representative of the detected input power level;
detecting the power level of the output signal and supplying a second DC voltage representative of the detected output power level; and
automatically adjusting the drain current based at least in part on a comparison of the second supplied DC voltage and the first supplied DC voltage by an amount necessary to maintain an essentially constant gain.

21. The method of claim 16, further comprising:
producing a negative voltage signal;
supplying a regulated negative voltage signal to the gate of the FET;
shutting down the negative voltage producing means after a wake-up transition; and
supplying a regulated negative voltage signal to the gate of the FET both during and after the wake-up transition.

* * * * *